United States Patent [19]

Daniels et al.

[11] 4,430,363

[45] Feb. 7, 1984

[54] PROCESS OF MAKING INFORMATION CARRYING SYSTEMS

[75] Inventors: Michael P. Daniels, Hastings; Robert J. Schoonover, Afton, both of Minn.

[73] Assignee: Minnesota Mining and Manufacturing Company, St. Paul, Minn.

[21] Appl. No.: 448,618

[22] Filed: Dec. 10, 1982

[51] Int. Cl.³ ............................................. B05D 3/06
[52] U.S. Cl. .................... 427/54.1; 264/1.4; 369/275; 427/162; 427/164
[58] Field of Search ............ 427/54.1, 162, 164, 427/165, 44; 118/213; 101/115; 369/275; 264/1.1, 1.4, 1.7, 2.7

[56] References Cited

U.S. PATENT DOCUMENTS

| | | | |
|---|---|---|---|
| 2,664,066 | 12/1953 | Martin | 118/213 |
| 3,658,954 | 4/1972 | Broadbent | 264/1 |
| 3,795,534 | 3/1974 | Mehalso et al. | 117/101 |
| 3,855,426 | 12/1974 | Bouwhuis | 179/100.3 |
| 4,124,672 | 11/1978 | Jarsen | 264/129 |
| 4,126,726 | 11/1978 | Soeding | 428/163 |
| 4,130,620 | 12/1978 | Jarsen | 264/225 |
| 4,179,532 | 12/1979 | Soeding | 427/54.1 |
| 4,199,421 | 4/1980 | Kamada et al. | 204/159.22 |
| 4,272,574 | 6/1981 | Lippits et al. | 428/64 |
| 4,275,091 | 6/1981 | Lippits et al. | 427/54.1 |
| 4,296,158 | 10/1981 | Lewis | 428/65 |
| 4,304,806 | 12/1981 | Anderson et al. | 428/65 |
| 4,373,065 | 2/1983 | Prest | 264/1.1 |

*Primary Examiner*—John H. Newsome
*Attorney, Agent, or Firm*—Donald M. Sell; James A. Smith; Mark A. Litman

[57] ABSTRACT

Polymerizable compositions are applied to substrates by a screen printing method in manufacturing video discs. This method reduces both relaxation times and internal stress marks in the polymerized composition.

14 Claims, 1 Drawing Figure

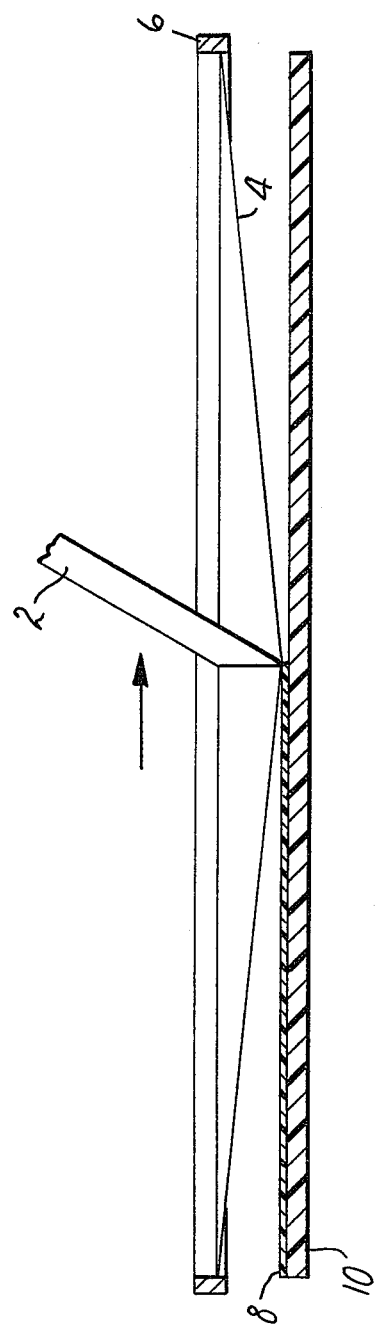

PROCESS OF MAKING INFORMATION CARRYING SYSTEMS

FIELD OF THE INVENTION

The present invention relates to processes useful in the manufacture of information carrying systems and particularly to processes useful in providing discs which carry light-readable or stylus-readable information thereon. These processes are particularly useful with solventless, radiation curable formulations which are photocured in molds to produce information carrying surfaces.

BACKGROUND OF THE INVENTION

The use of light-readable (particularly laser-readable) or stylus-readable information has provided new products in the market place for information retrieval. The most successful form of this technology exists in the format of video discs. These are flat, circular sheets having information encoded thereon in a pattern of grooves which are light-readable or stylus-readable on at least one surface of the disc. The encoded information on the discs is translatable to electronic information which can be projected in visual form on a cathode screen. A popular format for this technology exists as video discs which contain encoded information that can be viewed on television screens in the form of movies, plays, business presentations, and the like.

Many different variations in the systems are known in the art, and substantial volumes of literature have been published disclosing the various techniques used to manufacture and read information stored in this manner. For example, U.S. Pat. No. 3,855,426 discloses a video disc recording and optical playback system therefore in which a beam of radiation is used to read information off an information track. It is to be noted that in this and other light-readable systems, it is common to include parallel tracks, one containing information to be converted to a visual signal and a second track used to assist the optical playback system in tracking the information properly. U.S. Pat. No. 4,126,726 also discloses a two-sided radiation-readable information carrying disc. U.S. Pat. application Ser. No. 117,467, filed Feb. 1, 1980 in the name of Donald J. Kerfeld discloses a process for forming information carrying discs which can be read either by optical or stylus means.

A number of differing methods are used to form the information carrying disc. Some of the earliest methods attempted direct impression of the information carrying surface structure into thermoplastic polymeric blanks as is still presently done in the phonograph record art. This type of process is shown in U.S. Pat. No. 3,658,954. Subsequent improvements in the processes of manufacturing video discs used liquid compositions which could be heat cured or radiation cured in molds to provide the information carrying structure. These types of processes are shown, for example, in U.S. Pat. Nos. 4,126,726; 4,272,574; 4,017,581; 4,130,620; 3,795,534 and 4,124,672.

A broad spectrum of compositions has been disclosed for use in the manufacture of the cured information carrying layer. Such various materials as thermoplastic vinyl resins (U.S. Pat. No. 3,658,954), acrylics, epoxies and other polymerizable materials (U.S. Pat. No. 4,124,672), epoxy-terminated silanes (U.S. Pat. No. 4,304,806) and polyacryloyl-containing heterocyclic monomers (U.S. Pat. No. 4,296,158) and photopolymerizable laquers (U.S. Pat. No. 4,126,726) have been shown in the literature.

In spite of the broad and extensive disclosure of structures, processes and compositions useful in the formation of information carrying substrates, problems still exist in the art. In particular, compositions used in forming the information carrying structure of the discs have shown problems with regard to adherence to the substrate onto which the information carrying structure is formed, extensive shrinkage during molding, and internal stress marks.

BRIEF DESCRIPTION OF THE INVENTION

The present invention relates to a molding process which is useful in the formation of information carrying substrates such as video discs. The process comprises the application of a polymerizable composition to a substrate with a screen printing application of the composition and then subsequently polymerizing the composition in a mold to replicate an information carrying surface structure. A preferred composition comprises a monoethylenically unsaturated monomer, a polyethylenically unsaturated monomer, a thermoplastic polymer soluble in a solution of the monomers, and a latent initiator for the ethylenically unsaturated materials. The polymerizable composition is preferably solvent free and provides excellent adhesion to polymethylmethacrylate substrates and polycarbonate substrates and is receptive to the vapor deposition of reflective metal layers.

BRIEF DESCRIPTION OF THE DRAWING

The FIGURE shows an empirical drawing of the apparatus used in the practice of the present invention, including the polymerizable composition applicator 2, the screen 4, the screen supports 6, the coating 8, and the substrate 10.

DETAILED DESCRIPTION OF THE INVENTION

Polymerizable compositions are applied to the surface of a substrate by a screen printing process. The polymerizable composition passes through the mesh of a screen and is deposited onto the surface of the substrate. The composition is then subjected to any procedure which is capable of polymerizing the composition and forming therein an information carrying surface structure. Many various techniques are known which can perform these polymerizing and forming steps. For example, the coated substrate can be carried into an oven, embossed, and the composition heat cured. Similarly, actinic radiation which will polymerize the composition can be used in place of heat and the oven. The radiation may either be directed through the substrate or through the mold as known in the art. Embossing rolls may also be used, rather than platen molding surfaces, and again the actinic radiation may be directed through the substrate or through the mold.

The process for producing an information carrying article according to the present invention comprises:

(a) providing a fluid polymerizable composition onto one face of a screen having between 50 and 450 mesh, (b) passing the fluid polymerizable composition through said screen and onto at least one surface of a substrate, (c) confining said polymerizable composition between said at least one surface and at least one information coded surface,
(d) polymerizing said polymerizable composition while it is being confined, and
(e) removing said at least one information coded surface from the polymerized composition to leave a replicated coded surface structure on the polymerized composition.

A significant problem encountered in prior art processes has been the fact that very long relaxation times have been necessary in order to reduce internal stress marks in the applied composition. Even with relaxation times in excess of ten minutes, information distorting amounts of stress marks can often be found within the cured information carrying layer. These marks reduce the quality and dependability of such information carrying discs.

Although the specific mechanism that substantially eliminates relaxation times of more than a minute and also reduces stress marks in the information carrying layer is not completely understood, screen printing of polymerizable compositions effects these results. When the same composition is knife-coated, spin-coated, bar coated, gravure coated, and screen-printed, the screen printing application shows the smallest amount of internal stress marking and yet has the shortest relaxation time. This process of application, therefore, provides benefits both in the process (by reducing the total manufacturing time) and in the product (by improving the image quality).

Screen printing applications of liquid or viscous materials to substrates is itself known in the art, but its use and advantages in the formation of information carrying discs has not been heretofore described.

Screen printing involves the application of a liquid or viscous material to a surface through a screen or mesh. The material flows through the interstices of the screen either by force of gravity or by pressure applied to the composition. The rate of flow is controlled by varying the size of the holes in the mesh, altering the viscosity of the material, or changing the amount of pressure applied to the material. The mesh size may generally vary between 50 and 450 mesh which generally corresponds to a range of 70 to 15 percent open area in the screen, with approximately equal spacing and size of the openings. A preferred range of open area in the screen would correspond to 30 to 20 percent or between 250 and 400 mesh. The material of the screen is unimportant except that it should neither be soluble in the composition applied nor catalytically active to the composition. The rate of application of the composition is generally between 0.7 and 0.1 g/m²/sec. The final dry thickness of the polymerized composition is generally between 1 and 50 micrometers, preferably between 1 and 25 micrometers, and most preferably between 3 and 20 micrometers.

The compositions used in the practice of the present invention include any polymerizable compositions. The compositions may contain solvents or be solventless. They may be heat polymerizable, moisture vapor polymerizable, radiation polymerizable, or polymerizable by any other means. The chemical nature of the composition is not critical to the practice of the present invention, but, of course, some classes of compositions and specific materials are preferred.

The cured compositions need not even be transparent or translucent where stylus readable information carrying discs are to be manufactured. Preferably, however, the compositions are polymerized to a transparent coating or at least a coating which is translucent to thirty (30) percent of the radiation in a 5 nm band (such as between 600 and 700 nm and preferably at 653 nm) through a 3 micrometer thickness.

Preferred compositions include ethylenically unsaturated materials (e.g., acrylic, methacrylic, vinyl and allyl functional materials, particularly polyacryloyl and polymethacryloyl materials), epoxy resins (e.g., containing glycidoxy or cyclohexane oxide groups), silanes (e.g., tetraalkoxy silanes, tetraacryloxy silanes, mixed acryloxy and alkoxy silanes), ambifunctional materials (e.g., γ-glycidoxypropyltrimethoxy silane, γ-methacryloxypropyltriethoxy silane), and mixtures of compatible polymerizable materials (e.g., mixtures of (a) the epoxy-silane with epoxy resins or ethylenically unsaturated materials, and (b) the acryloyl- or methacryloyl-silane with ethylenically unsaturated materials). Some amount of compatible polymer binder, surfactants, catalyst, sensitizer, dyes, and other coating adjuvants or property modifiers may, of course, be added to the composition.

The preferred composition of the present invention comprises a solution of monoethylenically unsaturated monomers, polyethylenically unsaturated monomers, a thermoplastic polymer soluble in the ethylenically unsaturated monomers, and a latent initiator for the ethylenically unsaturated monomers. Ethylenically unsaturated polymerizable materials are well known in the art. These materials include acryloyl, methacryloyl, allyl, and vinyl materials. Acryloyl and methacryloyl functional materials are generally preferred.

Monoethylenically unsaturated monomers according to the present invention preferably have molecular weights between 80 and 500. Examples of monofunctional monomers according to the present invention are methylmethacrylate, methylacrylate, ethylacrylate, ethylmethacrylate, propylmethacrylate, n-butylacrylate, n-butylmethacrylate, tertbutylmethacrylate, 2-ethylhexylmethacrylate, stearylmethacrylate, cyclohexylmethacrylate, phenylmethacrylate, ethylcarbotilemethacrylate, butoxyethylmethacrylate, laurylacrylate, isobutylacrylate, tetrahydrofurfurylacrylate, 1,4-butane glycol monomethacrylate, and the like. Preferably the monofunctional acrylates will have a molecular weight between 150 and 250 according to the present invention.

The polyethylenically unsaturated monomers according to the present invention should generally have a molecular weight between 100 and 3,000. Examples of polyethylenically unsaturated materials according to the present invention include, for example, ethylene glycol diacrylate or dimethacrylate, 1,3-propane glycol diacrylate or dimethacrylate, 1,4-butanediol dimethacrylate or diacrylate, 1,6-hexanedioldimethacrylate or diacrylate, tetraethylene glycol dimethacrylate or diacrylate, neopentyl glycol dimethacrylate, 2,2-bis-(4-acryloxyethoxyphenyl) propane, 2,2-bis-(methacryloxyphenyl) propane, 2,2-bis-(4-acryloxy-(2-hydroxypropoxy) phenyl) propane, 2,2-bis-(4-methacryloxy(2-hydroxypropoxyethoxy) phenyl) propane, pentaerythrytol triacrylate or trimethacrylate, pentaerythrytol tetracrylate or tetramethacrylate, dipentaerythrytol triacrylate or trimethacrylate, dipentaerythrytol hexaacrylate or hexamethacrylate, trimethylol propane triacrylate or trimethacrylate, trimethylol ethane triacrylate or trimethacrylate, pentaglycerol triacrylate or trimethacrylate and the like. The polyethylenically unsaturated materials are preferably present as diethylenically unsaturated materials having a molecular weight between 100 and 2,000, and most preferably between 100 and 1,000. However, even oligomeric polyethylenically unsaturated materials of much higher molecular weights may be used.

Any film forming polymer which is soluble in the particularly selected monoethylenically unsaturated monomer and polyethylenically unsaturated monomer solution is useful in the practice of the present invention. Preferably acrylic thermoplastic polymeric materials are used in the practice of the present invention. These polymers should generally have a molecular weight of at least 10,000. Molecular weights as high as 500,000 or even a million may be used, but the preferred range is between 10,000 and 300,000. Homopolymers, copolymers, terpolymers and other materials formed by the combined reaction of different monomers are useful in the practice of the present invention. The polymer does not have to be reacted or reactable with the monomers, and in fact a substantial lack of reactive cites with the ethylenically unsaturated monomers is desirable in the polymer component. Particular polymers which are useful as this binder ingredient include homopolymers and copolymers of acrylates and methacrylates, homopolymers and copolymers of vinyl alcohol, vinyl chloride, vinyl acetate, polyesters, polyamides and polyethers. Particularly preferred polymers would include polyethylmethacrylate, polymethylmethacrylate and copolymer analogs of these materials. The terms acrylate polymer, methacrylate polymer, acrylic resin and methacrylic resin includes polymers having a multiplicity of monomer components as in copolymers, terpolymers, etc. as well as homopolymers. The thermoplastic polymer is generally used in amounts between 7.5 and 50 percent by weight of the total composition (taking into account only the monoethylenically unsaturated monomer and the polyunsaturaed monomer and the polymer). Preferably the polymer is present as 10 to 40 percent by weight of the total composition.

It is generally preferred that the ratio of the monoethylenically unsaturated monomer to the diethylenically unsaturated monomer exceed 1 to 7, is preferably greater than 1 to 6, and is most preferably greater than 1 to 5. The monoethylenically unsaturated monomer should likewise not be present in a ratio greater than 6 to 1, and preferably is present in a ratio of less than 4 to 1 with respect to the polyethylenically unsaturated monomer. The monoethylenically unsaturated monomer actually comprises between 7.5 and 45 percent of the composition and is preferably present as 10 to 40 percent by weight of the composition solids. The polyethylenically unsaturated monomer is actually present in the composition as 7.5 to 80 percent by weight of the composition, and is preferably present as 10 to 75 percent by weight of the composition. The polyethylenically unsaturated monomer also preferably has an ethylenically unsaturated equivalent weight of between 100 and 1,000, preferably between 100 and 500.

Any latent initiator may be used in the practice of the present invention, where that initiator is capable of polymerizing through ethylenic unsaturation. Both heat latent and radiation latent initiators are useful in the practice of the present invention, but radiation sensitive initiators, and particularly photoinitiators sensitive or sensitized to the infrared, visible or ultraviolet portions of the spectrum are preferred. Such free radical photoinitiators are well known in the art and include such materials as benzophenones, biimidiazoles, s-triazines, diazonium salts, iodonium salts, sulphonium salts, phosphonium salts, peroxides, and the like. These photoinitiators are generally used in amounts between 0.05 to 10 percent by weight of the composition, and in the practice of the present invention are preferably in amounts of 0.5 to 4 percent and most preferably 1 to 3 percent by weight of the composition. In addition to the free radical initiators themselves, dye sensitizers, as are known in the art, may also be used in combination with the free radical initiators. The use of such sensitizing dyes can broaden the spectral response of the composition and/or increase its sensitivity to curing radiation.

Other additives may be present in the composition of the present invention, such as coating aids, antioxidants, cure inhibitors, ultraviolet radiation absorbers, dyes, pigments, surfactants, antistatic agents and the like. The compositions of the present invention may be used without solvents, which is particularly desirable in the video disc art, but some solvent may be used if desired.

Viscosity of the compositions of the present invention should generally be between 20 and 20,000 centipoise at 20° C., preferably between 50 and 10,000 or 50 and 5,000, and most preferably between 500 and 1,000 centipoise.

It has been found that the combination of the three ingredients (the two monomers and the polymer binder) significantly improves the properties of the information carrying layer. The layer has been found to shrink less upon curing which reduces the stress in the information carrying layer. The composition shows increased adherence to polymethylmethacrylate, polycarbonate, and polyallyldiglycolcarbonate resin surfaces. The composition is also particularly receptive to the vapor deposition of metal reflective layers as is conventially done on the replicated coded surface structure in the formation of the video discs. A protective organic polymeric coating is also advantageously used over said vapor-deposited metal layer. The composition is also quite durable to the stress and abrasion anticipated in the normal use of video discs.

These and other aspects of the present invention will be shown in the following non-limiting examples.

EXAMPLE 1

A solventless radiation curable formulation was prepared by combining 24.5 g of polyethylmethacrylate resin having an inherent viscosity of 0.2, 44.1 g of 1,6-hexane diol diacrylate, 29.4 g of 2,2-ethoxyethoxyethylacrylate and 2 grams dimethoxy phenyl acetophenone in a one half pint metal container. The can was shaken vigorously for two hours to produce a solution of the materials having a viscosity of 390 cp. at 20° C. The solution was applied to a polymethylmethacrylate video disc substrate by the following process.

Referring to the FIGURE, a 390 mesh monofilament polyester screen 4, was supported at parallel ends by two clamp action screen supports 6. A stiff rubber edge applicator (squeegee) 2 was used to move the polymerizable composition 12 over the upper surface of the screen 4 so that it would pass through the mesh openings onto the substrate 10 to form a coating 8. The screen 4 was held by the supports 6 with sufficient play in the screen so that while the applicator 2 moved across the upper surface of the screen 4, the screen 4 would contact or be contiguous to the point of application of the composition 12 to the substrate.

The coating which had a thickness of 7.6 microns was allowed to sit on the substrate surface for sufficient time (thirty seconds) to flow out smoothly and to chemically contact the substrate surface. A rubber roll having a durometer hardness of 70 was used to press a metalized flexible polyester stamper into the coated composition. Ultraviolet radiation was projected through the stamper and into the composition while moving across the disc at a rate of 3.8 centimeters per second using a 125 watt per inch high intensity, medium pressure, mercury vapor lamp. The curing step was repeated a second time. The stamper was removed from the disc and the disc vacuum metalized with aluminum (50 millimicrons). The coating displayed excellent adhesion to the disc substrate and excellent adhesion to the aluminum film as measured by Cross Hatch tape test. The signal to noise ratio was measured and found to be within the range of 41–46 decibels. The disc was played on a disc player and produced a good video picture.

EXAMPLE 2

A solventless radiation curable formulation was prepared by combining 34.3 g of polyethylmethacrylate, 53.9 g of 1,6-hexanediol diacrylate, 9.8 g of 2,2-ethoxyethoxy-ethylacrylate and 2 g of dimethoxy phenyl acetophenone in a one half pint can as in Example 1. The formulation had a viscosity of 6,300 cp. and produced discs with adhesion and signal to noise the same as in Example 1.

EXAMPLE 3

A solventless radiation curable formulation was prepared by combining 34.3 g of polyethylmethacrylate, 44.1 g of 1,6-hexanediol diacrylate, 19.6 g of 2,2-ethoxyethoxy-ethylacrylate and 2 g of dimethoxy phenyl acetophenone in a one half pint can as in Example 1. The formulation viscosity was 4,900 cp. and produced discs with adhesion and signal to noise as in Example 1.

EXAMPLE 4

A solventless radiation curable formulation was prepared by combining 24.5 g of polyethylmethacrylate, 53.9 g of 1,6-hexanediol diacrylate, 19.6 g of 2,2-ethoxyethoxy-ethylacrylate and 2 g of dimethoxy phenyl acetophenone as in Example 1. The formulation had a viscosity of 530 cp. which made discs with signal to noise and adhesion the same as in Example 1.

EXAMPLE 5

A solventless radiation curable formulation was prepared by combining 31.4 g of polyethylmethacrylate, 50.5 g of 1,6-hexanediol diacrylate, 16.1 g of 2,2-ethoxyethoxy-ethylacrylate and 2 g of dimethoxy phenyl acetophenone as in Example 1. The formulation had a viscosity of 2,900 cp. which made discs with signal to noise and adhesion as in Example 1.

EXAMPLE 6

A solventless radiation curable formulation was prepared by combining 29.4 g of polyethylmethacrylate, 39.2 g of 1,6-hexanediol diacrylate, 29.4 g of 2,2-ethoxyethoxy-ethylacrylate and 2 g of dimethoxy phenyl acetophenone as in Example 1. This formulation was also made in volumes up to 3,000 grams with results the same as 100 gram batches. The formulation had a viscosity of 1,200 cp. which made discs with signal to noise and adhesion as in Example 1.

EXAMPLE 7

A solventless radiation curable formulation was prepared by combining 44.1 g of polyethylmethacrylate, 44.1 g of 1,6-hexanediol diacrylate, 9.8 g of 2,2-ethoxyethoxy-ethylacrylate and 2 g of dimethoxy phenyl acetophenone as in Example 1. The formulation had a viscosity of 98,000 cp. and was too viscous to pass through the mesh or to process further or test.

EXAMPLE 8

A solventless radiation curable formulation was prepared by combining 24.5 g of polyethylmethacrylate, 63.7 g of 1,6-hexanediol diacrylate, 9.8 g of 2,2-ethoxyethoxy-ethylacrylate and 2 g of dimethoxy phenyl acetophenone as in Example 1. The formulation had a viscosity of 560 cp. which made copies which had only fair substrate adhesion but otherwise were the same as Example 1. The less than optimum substrate adhesion would mean this formulation is undesirable.

To show the improvement provided by the ternary composition of the present invention, binary systems using the materials and proportions of Example 8 were made and evaluated. The binary system with polyethylmethacrylate and 1,6-hexanediol diacrylate resulted in poor adhesion to the substrate. The binary system with polyethylmethacrylate and 2,2-ethoxyethoxy-ethylacrylate were too viscous, difficult to coat, and adhered poorly to the substrate. It is clearly surprising that a combination of the three ingredients adheres so well to the same substrate.

The structure of the information carrying discs usually comprises either a spiral or circular track of encoded information in the form of reflective bumps or depressions or a groove having encoded information in the form of bumps or depressions readable by a stylus. In the practice of the present invention, the term groove shall mean either the spiral or circular track or the grooved path used in the art. The dimensions disclosed in U.S. Pat. No. 4,304,806 for the dimensions of the grooves, bumps and depressions are incorporated herein by reference.

What is claimed is:

1. A process for producing an information carrying article comprising:
   (a) providing a fluid polymerizable composition onto one face of a screen having between 50 and 450 mesh,
   (b) passing the fluid polymerizable composition through said screen and onto at least one surface of a substrate,
   (c) confining said polymerizable composition between said at least one surface and at least one information coded surface,
   (d) polymerizing said polymerizable composition while it is being confined, and
   (e) removing said at least one information coded surface from the polymerized composition to leave a replicated coded surface structure on the polymerized composition.

2. The process of claim 1 wherein said article is an information carrying disc.

3. The process of claim 1 wherein a metal layer is vapor-deposited on the replicated coded surface structure.

4. The process of claim 2 wherein a metal layer is vapor-deposited on the replicated coded surface structure.

5. The process of claim 3 wherein a protective organic polymeric coating is provided over said vapor-deposited metal layer.

6. The process of claim 4 wherein a protective organic polymeric coating is provided over said vapor-deposited metal layer.

7. The process of claim 1 wherein said polymerizable composition comprises at least one ethylenically unsaturated material.

8. The process of claim 2 wherein said polymerizable composition comprises at least one ethylenically unsaturated material.

9. The process of claim 4 wherein said polymerizable composition comprises at least one ethylenically unsaturated material.

10. The process of claim 6 wherein said polymerizable composition comprises at least one ethylenically unsaturated material.

11. The process of claim 2 wherein said polymerizable composition is photopolymerizable and polymerization is effected by irradiating said composition with actinic radiation.

12. The process of claim 2 wherein said polymerizable composition is a photopolymerizable ethylenically unsaturated composition and polymerization is effected by irradiating said composition with actinic radiation.

13. The process of claim 12 wherein said polymerizable composition is an acryloyl or methacryloyl ethylenically unsaturated composition.

14. The process of claim 13 wherein said polymerizable composition comprises
    (a) 7.5 to 45 percent by weight of a monoethylenically unsaturated monomer having a molecular weight between 80 and 500,
    (b) 7.5 to 80 percent by weight of a polyethylenically unsaturated monomer having a molecular weight between 100 and 3000,
    (c) 7.5 to 50 percent by weight of an organic polymer having a molecular weight of at least 10,000 which is soluble in a solution of (a) and (b), and
    (d) an effective amount of a latent free-radical initiator, the ratio of said monoethylenically unsaturated monomer to said polyethylenically unsaturated monomer being greater than 1 to 7 and less than 6 to 1, and the viscosity of the composition being between 20 and 20,000 centipoise at 20° C.

* * * * *